United States Patent
Yin et al.

(10) Patent No.: US 10,185,351 B2
(45) Date of Patent: Jan. 22, 2019

(54) FOLDABLE WATER-COOLING DEVICE

(71) Applicant: ASIA VITAL COMPONENTS CO., LTD., New Taipei (TW)

(72) Inventors: Jianwu Yin, New Taipei (TW); Rongxian Zhang, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 302 days.

(21) Appl. No.: 14/749,645

(22) Filed: Jun. 25, 2015

(65) Prior Publication Data
US 2016/0381828 A1 Dec. 29, 2016

(51) Int. Cl.
| G06F 1/16 | (2006.01) |
| F01P 5/10 | (2006.01) |
| F28D 15/00 | (2006.01) |
| G06F 1/20 | (2006.01) |
| H01L 23/473 | (2006.01) |

(52) U.S. Cl.
CPC .................. G06F 1/16 (2013.01); F01P 5/10 (2013.01); F28D 15/00 (2013.01); G06F 1/203 (2013.01); *G06F 2200/201* (2013.01); *H01L 23/473* (2013.01)

(58) Field of Classification Search
CPC ............. F28D 2021/0028; F28D 15/00; H01L 23/473; H01L 23/34; F28F 9/001; F28F 9/005; F28F 2255/02; F28F 9/26; F28F 3/02; F28F 13/06; E05D 3/12
USPC .................................................. 16/366, 369
See application file for complete search history.

(56) References Cited

U.S. PATENT DOCUMENTS

| 6,256,194 | B1* | 7/2001 | Choi | G06F 1/1616 |
| | | | | 292/4 |
| 6,612,668 | B2* | 9/2003 | Doan | G06F 1/1616 |
| | | | | 16/303 |
| 2002/0036890 | A1* | 3/2002 | Furuya | H01L 23/427 |
| | | | | 361/702 |
| 2003/0214786 | A1* | 11/2003 | Niwatsukino | G06F 1/203 |
| | | | | 361/699 |
| 2004/0027800 | A1* | 2/2004 | Tanimoto | G06F 1/203 |
| | | | | 361/679.53 |
| 2004/0042174 | A1* | 3/2004 | Tomioka | G06F 1/203 |
| | | | | 361/679.53 |
| 2004/0042184 | A1* | 3/2004 | Tomioka | G06F 1/203 |
| | | | | 361/752 |

(Continued)

*Primary Examiner* — Orlando E Aviles Bosques
*Assistant Examiner* — Jose O Class-Quinones
(74) *Attorney, Agent, or Firm* — Jackson IPG PLLC; Demian K. Jackson (57) ABSTRACT

A bendable water-cooling device includes: a pump unit having a pump case and a driver. The pump case has a pump chamber, a first inlet and a first outlet. The pump case is formed with a first pivotal connection section on the same side as the first outlet; a heat exchange unit having a liquid reservoir case and a heat dissipation member, the liquid reservoir case having a heat exchange chamber, a second inlet and a second outlet, the liquid reservoir case being formed with a second pivotal connection section on the same side as the second inlet; and a pivot unit having a first mating section and a second mating section respectively pivotally connected with the first and second pivotal connection sections. The pump unit and the heat exchange unit are bendable around the pivot unit from a horizontal position to an upper and lower overlapping position.

4 Claims, 6 Drawing Sheets

(56) References Cited

U.S. PATENT DOCUMENTS

| | | | |
|---|---|---|---|
| 2004/0070942 A1* | 4/2004 | Tomioka | G06F 1/203 |
| | | | 361/700 |
| 2004/0114324 A1* | 6/2004 | Kusaka | G06F 1/203 |
| | | | 361/679.53 |
| 2010/0232110 A1* | 9/2010 | Ippoushi | F25B 39/02 |
| | | | 361/699 |
| 2013/0155615 A1* | 6/2013 | Liu | H05K 7/20145 |
| | | | 361/695 |
| 2014/0069614 A1* | 3/2014 | Chiu | F28D 15/00 |
| | | | 165/104.13 |

* cited by examiner

FOLDABLE WATER-COOLING DEVICE

BACKGROUND OF THE INVENTION

1. Field of the Invention

The present invention relates generally to a bendable water-cooling device, and more particularly to a water-cooling device, which can be freely bent or folded back onto itself in accordance with an existent space in an electronic device. Therefore, the water-cooling device can be adaptively disposed in the electronic device.

2. Description of the Related Art

When an electronic device works, the CPU or the other processor will generate heat. The heat must be quickly and efficiently dissipated. Currently, the most widely used cooling means for the CPU or the other processor is mainly an air-cooling device. The air-cooling device employs a heat sink and cooling fan as the heat dissipation means. Another type of cooling device that utilizes a cooling liquid to cool the CPU or the other processor has been developed, for example, a cooling system for heat generation component. The cooling system includes a double-faced base seat for receiving a pump to circulate a cooling liquid. The pump includes a stator and an impeller. The impeller is disposed on the bottom side of the base seat. The stator is disposed to the top side of the base seat and isolated from the cooling liquid. A cooling system further includes a liquid reservoir chamber for the cooling liquid to pass therethrough. The liquid reservoir includes a pump chamber formed on lower side of the base seat, in which the impeller is disposed. At least one impeller cover body defines the pump chamber. The impeller cover body has one or more flow passages for the cooling liquid to pass through. A heat exchange chamber is formed under the pump chamber and perpendicularly separated from the pump chamber. The pump chamber and the heat exchange chamber are separate chambers and communicate with each other through one or more passages. A heat exchange interface is formed on one side of the heat exchange chamber in contact with a heat generation component. A heat sink is connected to the liquid reservoir chamber. The cooling liquid serves to carry away the heat of the heat sink. Also, an electronic device with a pump includes a liquid reservoir case having a heat generation component. A heat dissipation section serves to dissipate the heat generated by the heat generation component. The electronic device further includes a pump unit having an impeller and a heat absorption section thermally connected to the heat generation component. The impeller of the pump unit rotates to supply cooling liquid to the heat dissipation section. The cooling liquid circulates in a circulation path between the heat absorption section and the heat dissipation section, whereby the heat generated by the heat generation component can be transferred to the heat dissipation section via the cooling liquid. The center of the impeller of the pump unit and the center of the heat generation component are separately disposed. In the conventional water-cooling system, the liquid reservoir case and the pump unit have numerous components. These components are directly assembled and mounted in one single double-faced base seat. Moreover, the liquid reservoir case must be vertically partitioned into an upper chamber and a lower chamber. Such structure makes it impossible to freely arrange the liquid reservoir case and the pump unit in the same horizontal position. As a result, the cooling system cannot be freely disposed in the existent space in the electronic device.

It is therefore tried by the applicant to provide a bendable water-cooling device to solve the above problems of the conventional water-cooling system.

SUMMARY OF THE INVENTION

It is therefore a primary object of the present invention to provide a bendable/foldable water-cooling module, which can be bent or folded back onto itself.

It is a further object of the present invention to provide a bendable/foldable water-cooling device, which can be freely bent in accordance with an existent space in an electronic device and adaptively disposed in the electronic device.

To achieve the above and other objects, the bendable water-cooling device of the present invention includes a pump unit, a heat exchange unit, a pivot unit and a tube body. The pump unit has a pump case and a driver. The pump case has a pump chamber, a first inlet and a first outlet. The pump case is formed with a first pivotal connection section on the same side as the first outlet. The first inlet and the first outlet communicate with the pump chamber. The driver is disposed in the pump chamber and immerged in a cooling liquid. The heat exchange unit has a liquid reservoir case and a heat dissipation member. The liquid reservoir case has a heat exchange chamber and a second inlet and a second outlet. The liquid reservoir case is formed with a second pivotal connection section on the same side as the second inlet. The second inlet and the second outlet communicate with the heat exchange chamber. The heat exchange chamber is for the cooling liquid to pass through. The pivot unit has a first mating section and a second mating section. The first mating section is correspondingly pivotally connected with the first pivotal connection section. The second mating section is correspondingly pivotally connected with the second pivotal connection section. The pump unit and the heat exchange unit are bendable around the pivot unit from a horizontal position to an upper and lower overlapping position. The tube body passes through the pivot unit. The tube body has a first water outlet and a second water outlet. The first water outlet is correspondingly connected with the first outlet. The second water outlet is correspondingly connected with the second inlet.

According to the above arrangement, the first and second mating sections of the pivot unit are respectively pivotally connected with the first and second pivotal connection sections of the pump case and the liquid reservoir case. Therefore, the pump unit and the heat exchange unit can be bent around the pivot unit from a horizontal position to an upper and lower overlapping position or another position with height difference, whereby the pump unit and the heat exchange unit are not positioned on the same level. Moreover, the water-cooling device can be freely bent in accordance with the size of the existent space in an electronic device, whereby the water-cooling device can be adaptively mounted in the electronic device.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
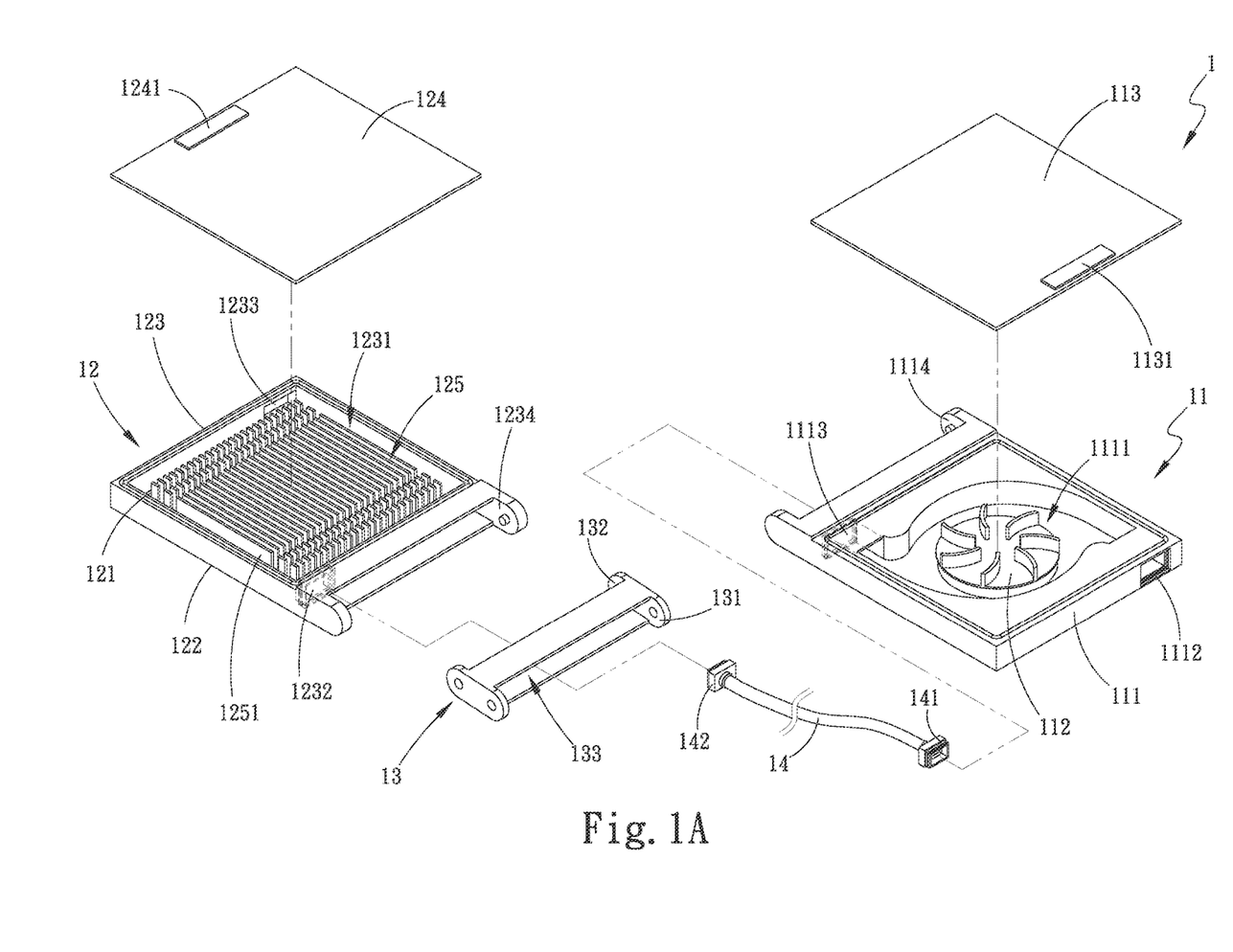
FIG. 1A is a perspective exploded view of a first embodiment of the bendable water-cooling device of the present invention.
Figure 1B:
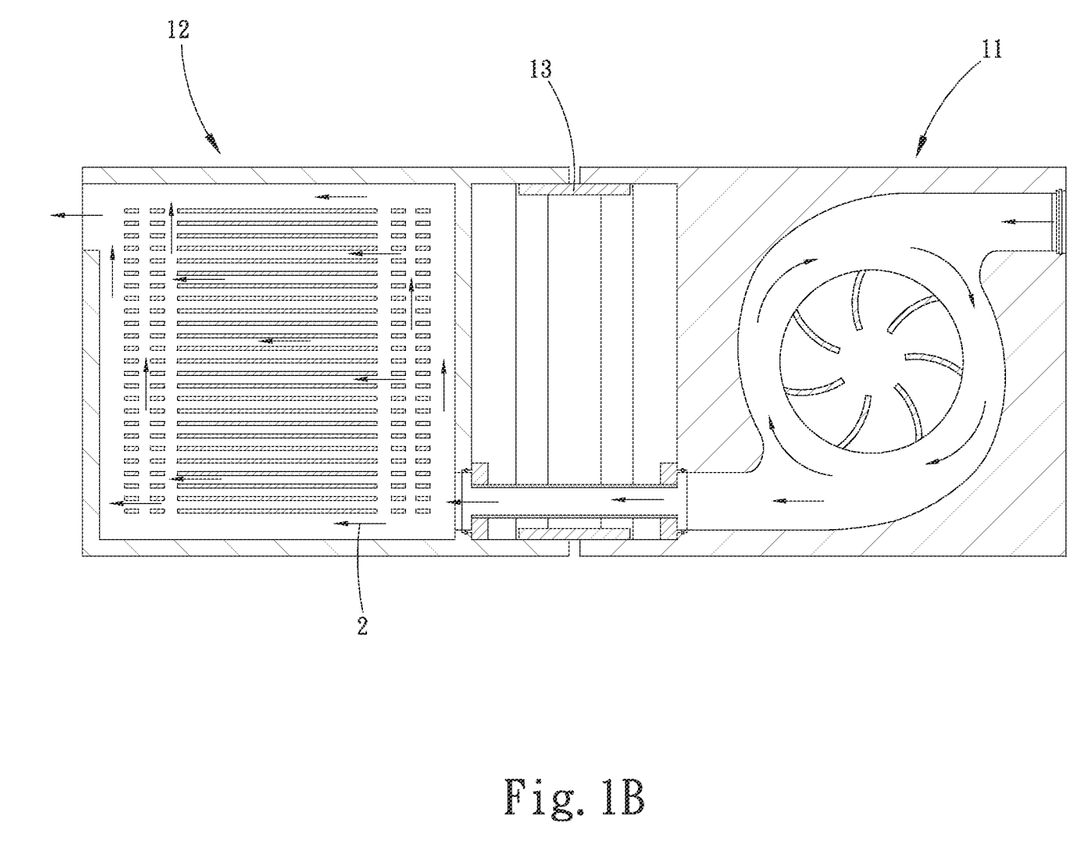
FIG. 1B is a top sectional view of the first embodiment of the bendable water-cooling device of the present invention.
Figure 2:
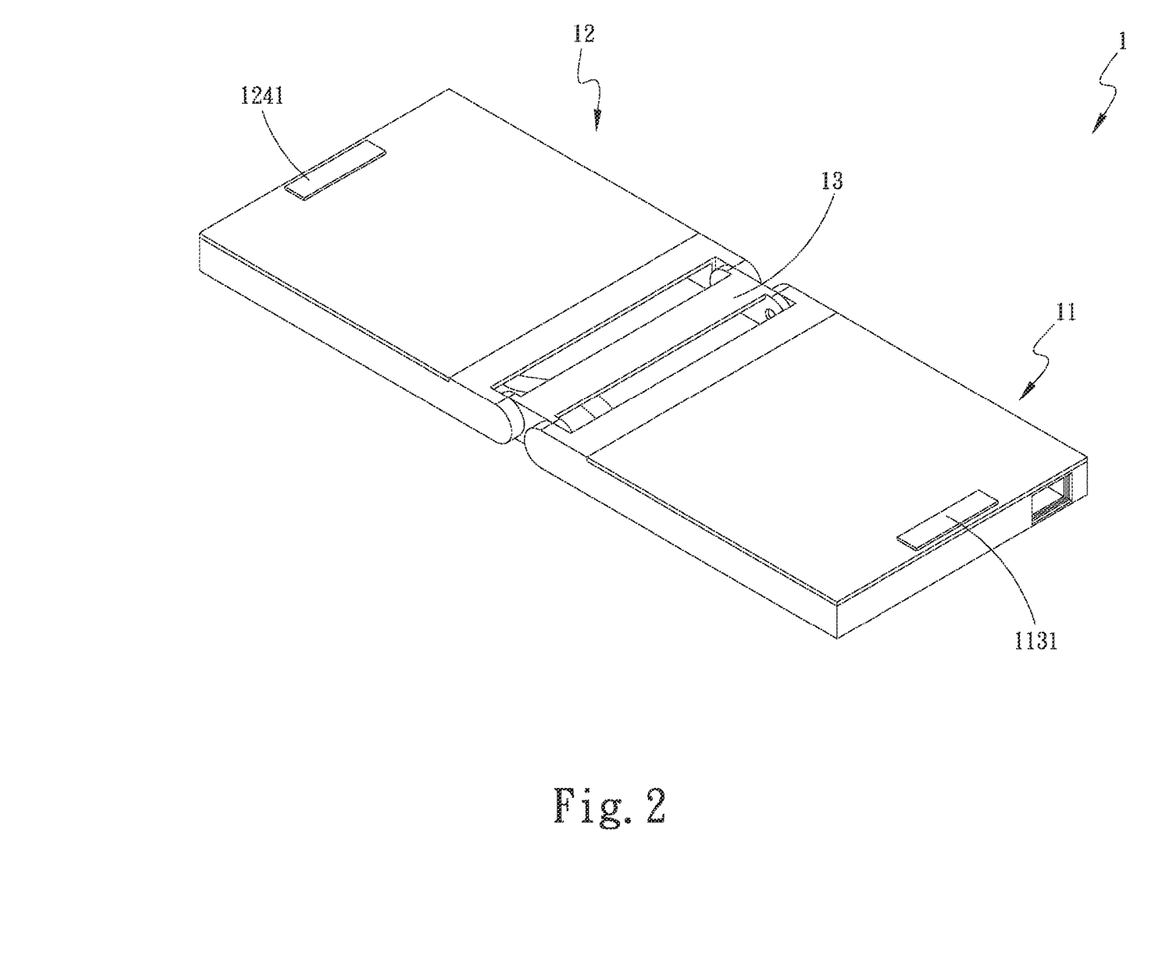
FIG. 2 is a perspective assembled view of the first embodiment of the bendable water-cooling device of the present invention.

Please refer to FIGS. 1A, 1B and 2. FIG. 1A is a perspective exploded view of a first embodiment of the bendable water-cooling device of the present invention. FIG. 1B is a top sectional view of the first embodiment of the bendable water-cooling device of the present invention. FIG. 2 is a perspective assembled view of the first embodiment of the bendable water-cooling device of the present invention. According to the first embodiment, the bendable water-cooling device 1 of the present invention includes a pump unit 11, a heat exchange unit 12, a pivot unit 13 and a tube body 14. The pump unit 11 has a pump case 111 and a driver 112. The pump case 111 has a pump chamber 1111, a first inlet 1112 and a first outlet 1113. The pump case 111 is formed with a first pivotal connection section 1114 on the same side as the first outlet 1113. The first inlet 1112 and the first outlet 1113 communicate with the pump chamber 1111. The driver 112 is disposed in the pump chamber 1111 and immerged in a cooling liquid 2.

The heat exchange unit 12 has a liquid reservoir case 123 and a heat dissipation member 125. The liquid reservoir case 123 has a heat exchange chamber 1231 and a second inlet 1232 and a second outlet 1233. The liquid reservoir case 123 is formed with a second pivotal connection section 1234 on the same side as the second inlet 1232. The second inlet 1232 and the second outlet 1233 communicate with the heat exchange chamber 1231. The heat exchange chamber 1231 is for the cooling liquid 2 to pass through. The heat exchange unit 12 has a heat exchange face 121 facing the heat exchange chamber 1231 and a heat contact face 122 opposite to the heat exchange face 121. The heat dissipation member 125 has multiple radiating fins 1251, which are arranged on the heat exchange face 121 at intervals or to intersect each other. The radiating fins 1251 contact the cooling liquid 2 in the heat exchange chamber 1231. The heat contact face 122 contacts a heat source such as a central processing unit or graphics processing unit or other electronic component (not shown).

The pivot unit 13 has a first mating section 131 and a second mating section 132. The first mating section 131 is correspondingly pivotally connected with the first pivotal connection section 1114. The second mating section 132 is correspondingly pivotally connected with the second pivotal connection section 1234. The pump unit 11 and the heat exchange unit 12 can be bent around the pivot unit 13 from a horizontal position to an upper and lower overlapping position or a position with height difference, whereby the pump unit 11 and the heat exchange unit 12 are not positioned on the same level. The pivot unit 13 has a hollow section 133.

The tube body 14 passes through the hollow section 133 of the pivot unit 13. The tube body 14 has a first water outlet 141 and a second water outlet 142. The first water outlet 141 is correspondingly connected with the first outlet 1113. The second water outlet 142 is correspondingly connected with the second inlet 1232. The cooling liquid 2 in the pump case 111 will flow out from the first outlet 1113 through the tube body 14 into the second inlet 1232 of the liquid reservoir case 123 and then flow into the heat exchange chamber 1231 through the heat dissipation member 125 and then flow out from the second outlet 1233 to achieve heat dissipation effect. Alternatively, the cooling liquid 2 can flow in a reverse direction, (that is, flow from the heat exchange chamber 1231 through the pump chamber 1111 and flow out from the first inlet 1112).

Figure 3:
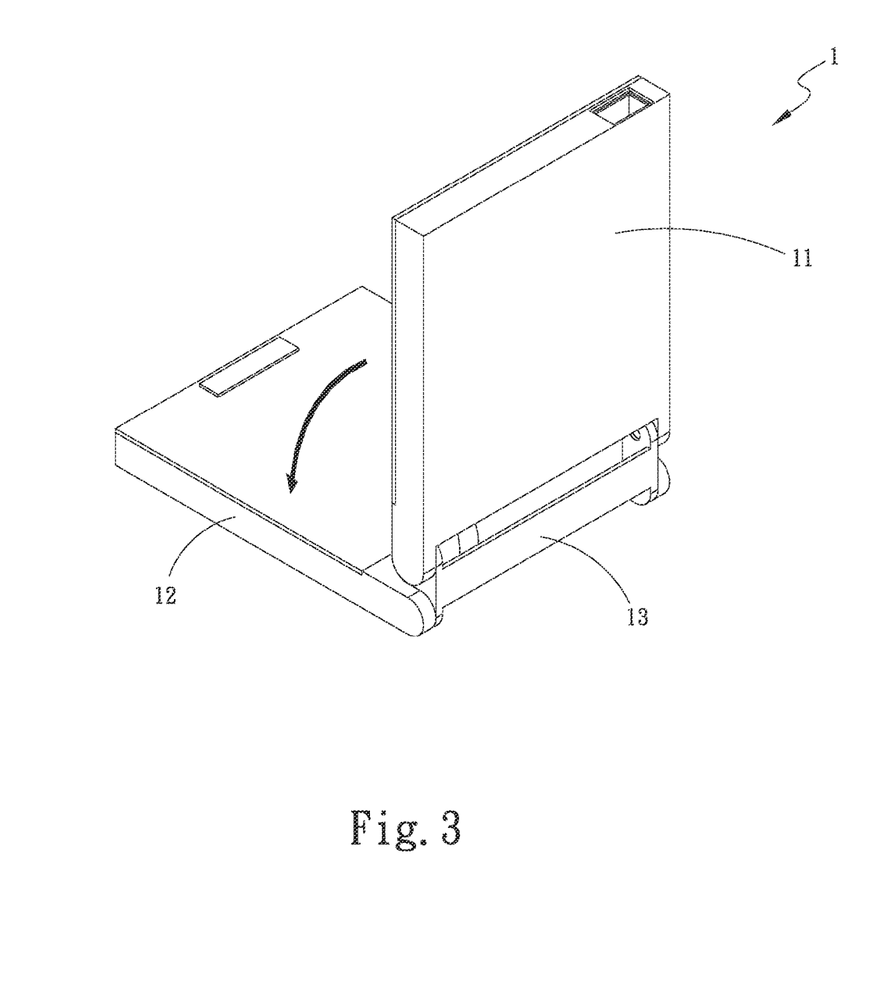
FIG. 3 is a perspective view of the first embodiment of the bendable water-cooling device of the present invention in a partially folded state.
Figure 4:
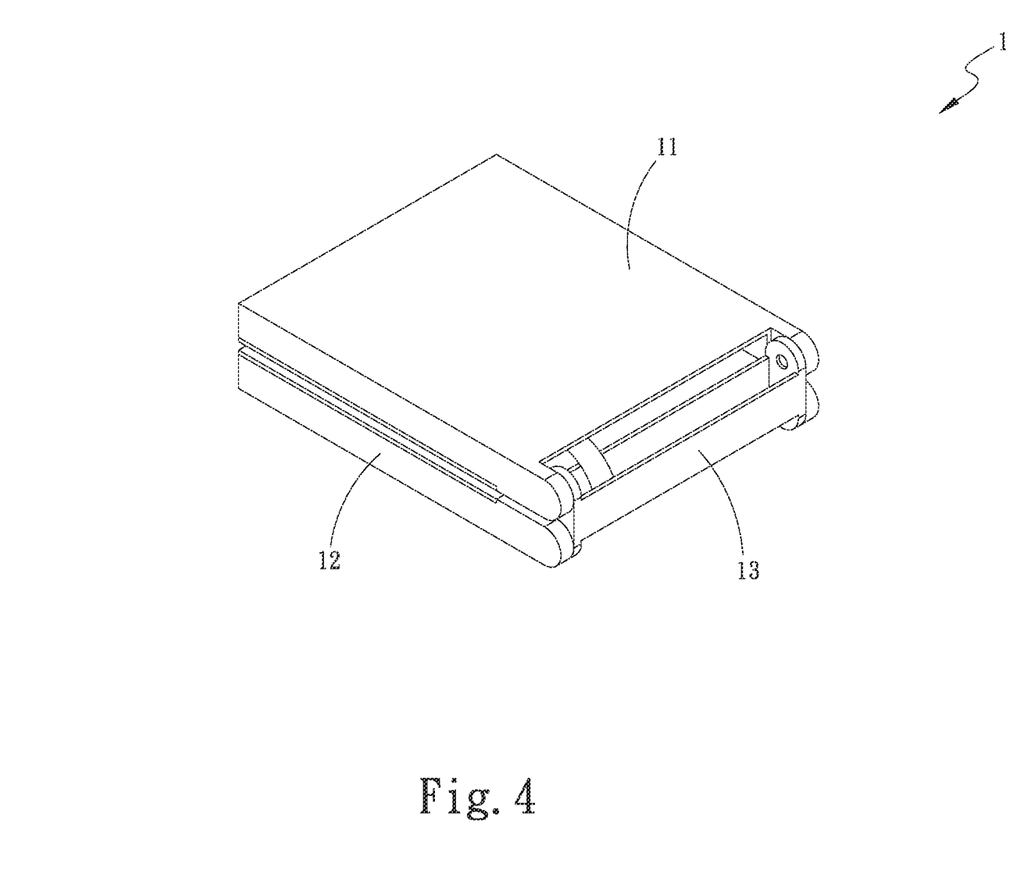
FIG. 4 is a perspective view of the first embodiment of the bendable water-cooling device of the present invention in a fully folded state.

Please refer to FIGS. 3 and 4. FIG. 3 is a perspective view of the first embodiment of the bendable water-cooling device of the present invention in a partially folded state. FIG. 4 is a perspective view of the first embodiment of the bendable water-cooling device of the present invention in a fully folded state. In this embodiment, the pump case 111 further has a first top board 113. A first connection section 1131 is disposed on the first top board 113. The liquid reservoir case 123 further has a second top board 124. A second connection section 1241 is disposed on the second top board 124. The first and second top boards 113, 124 are respectively connected with the pump case 111 and the liquid reservoir case 123 by a means selected from a group consisting of insertion, screwing, adhesion, pressing and welding.

According to the above arrangement, the first mating section 131 of the pivot unit 13 is pivotally connected with the first pivotal connection section 1114 of the pump case 111. The second mating section 132 is pivotally connected with the second pivotal connection section 1234. Therefore, the pump unit 11 and the heat exchange unit 12 can be bent around the pivot unit 13 from a horizontal position to an upper and lower overlapping position. Accordingly, the water-cooling device 1 can be bent or folded. In addition, the first connection section 1131 disposed on the first top board 113 and the second connection section 1241 disposed on the second top board 124 can be mated and connected with each other to keep the pump unit 11 and the heat exchange unit 12 in a folded state. Moreover, the water-cooling device 1 can be mounted in an electronic device (not shown). When the electronic device is shaken or moved, the pump unit 11 and the heat exchange unit 12 of the water-cooling device 1 can still securely keep in the folded state. Also, the water-cooling device 1 can be bent in accordance with the size of the existent space in the electronic device, whereby the water-cooling device 1 can be adaptively mounted in the electronic device.

Figure 5:
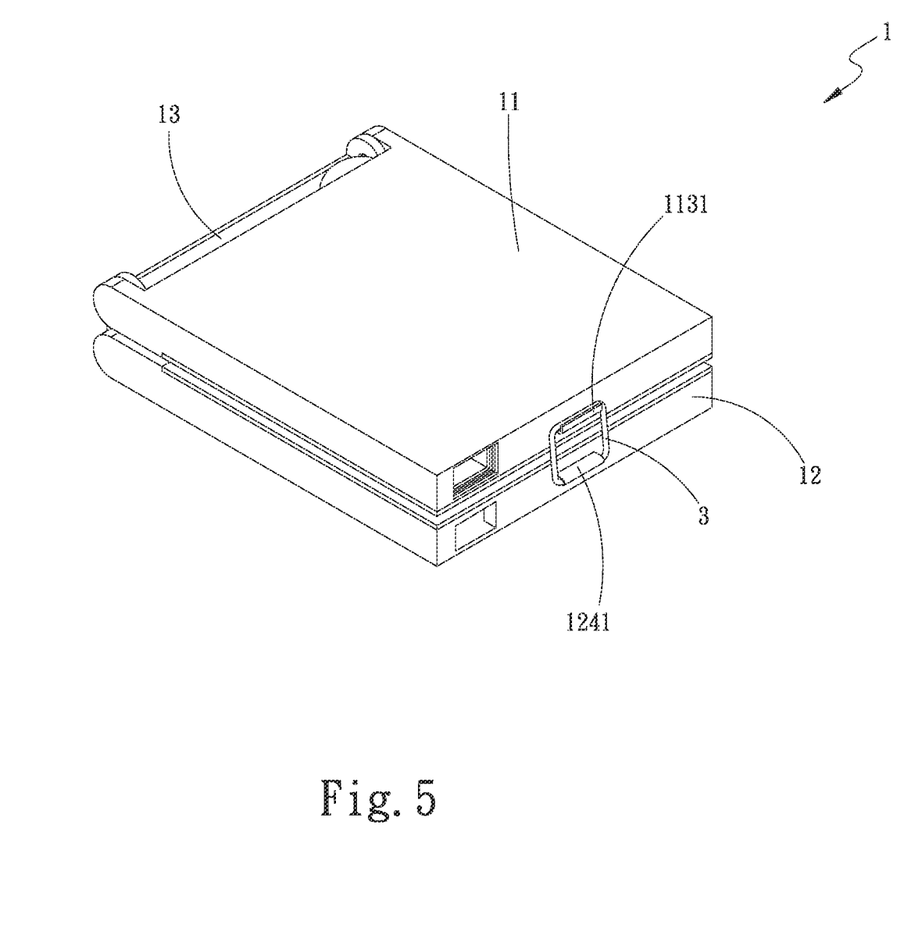
FIG. 5 is a perspective view of a second embodiment of the bendable water-cooling device of the present invention in a fully folded state.

Please now refer to FIG. 5 as well as FIG. 1A. FIG. 5 is a perspective view of a second embodiment of the bendable water-cooling device of the present invention in a fully folded state. The second embodiment is partially identical to the first embodiment in structure, component and relationship between components and thus will not be repeatedly described hereinafter. The second embodiment is mainly different from the first embodiment in that the first and second connection sections 1131, 1241 are connected with each other via a connection member 3. The first mating section 131 of the pivot unit 13 is pivotally connected with the first pivotal connection section 1114. The second mating section 132 of the pivot unit 13 is pivotally connected with the second pivotal connection section 1234. Therefore, the pump unit 11 and the heat exchange unit 12 can be bent around the pivot unit 13 from a horizontal position to an upper and lower overlapping position. In addition, the first connection section 1131 and the second connection section 1241 can be mated and connected with each other by means of the connection member 3 to securely keep the pump unit 11 and the heat exchange unit 12 in a folded state. Moreover, the water-cooling device 1 can be bent in accordance with the size of the existent space in an electronic device, whereby the water-cooling device 1 can be adaptively mounted in the electronic device.

In comparison with the conventional water-cooling device, the present invention has the following advantages:

1. The water-cooling device of the present invention is bendable and transformable.

2. The water-cooling device can be freely bent in accordance with the size of the existent space in an electronic device and adaptively mounted in the electronic device.

The present invention has been described with the above embodiments thereof and it is understood that many changes and modifications in the above embodiments can be carried out without departing from the scope and the spirit of the invention that is intended to be limited only by the appended claims.

What is claimed is:

1. A foldable water-cooling device comprising:
a pump unit consisting of a pump case, a driver, a first top board, a pump chamber, a first inlet, a first outlet, and a first pivotal connection section integrally formed on a same side as the first outlet, the first inlet and the first outlet communicating with the pump chamber, the driver disposed in the pump chamber and immerged in a cooling liquid;
a heat exchange unit having a liquid reservoir case and a heat dissipation member, the liquid reservoir case having a heat exchange chamber, a second inlet and a second outlet, the liquid reservoir case integrally formed with a second pivotal connection section on a same side as the second inlet, the second inlet and the second outlet communicating with the heat exchange chamber, the heat exchange chamber for the cooling liquid to pass through, a heat exchange face facing the heat exchange chamber and a heat contact face facing opposite to the heat exchange face and contacting a heat source;
a pivot unit having a first mating section, a second mating section, and a hollow section, the first mating section correspondingly pivotally connected with the first pivotal connection section about a first axis, the second mating section correspondingly pivotally connected with the second pivotal connection section about a second axis, wherein the first and second axes are displaced from one another, the first and second mating sections being directly connected to the pump case and the liquid reservoir case respectively, the pump unit and the heat exchange unit foldable around the pivot unit from a horizontal position to an upper and lower overlapping position; and
a tube body passing through the hollow section, the tube body having a first water outlet and a second water outlet, the first water outlet correspondingly connected with the first outlet, the second water outlet correspondingly connected with the second inlet, the foldable water-cooling device mounted in an electronic device.

2. The foldable water-cooling device as claimed in claim 1, wherein the heat dissipation member has multiple radiating fins, which are arranged on the heat exchange face at intervals or to intersect each other, the radiating fins contacting the cooling liquid in the heat exchange chamber.

3. The foldable water-cooling device as claimed in claim 1, wherein the first connection section is disposed on the first top board, the liquid reservoir case further having a second top board and a second connection section disposed on the second top board, whereby the first connection section and the second connection section are mated and connected with each other to keep the pump unit and the heat exchange unit in a folded state.

4. The foldable water-cooling device as claimed in claim 3, wherein the first connection section and the second connection section are mated and connected with each other by a connection member.

* * * * *